US006393038B1

(12) United States Patent
Raymond et al.

(10) Patent No.: US 6,393,038 B1
(45) Date of Patent: May 21, 2002

(54) FREQUENCY-DOUBLED VERTICAL-EXTERNAL-CAVITY SURFACE-EMITTING LASER

(75) Inventors: Thomas D. Raymond, Edgewood; William J. Alford, Albuquerque; Mary H. Crawford, Albuquerque; Andrew A. Allerman, Albuquerque, all of NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 09/412,044

(22) Filed: Oct. 4, 1999

(51) Int. Cl.[7] ............................. H01S 3/10; H01S 5/00
(52) U.S. Cl. ......................... 372/22; 372/50; 372/98; 372/75
(58) Field of Search ........................ 372/22, 43, 45, 372/50, 72, 75, 93, 98, 99

(56) References Cited

U.S. PATENT DOCUMENTS

| 4,847,851 A | * | 7/1989 | Dixon | 372/75 |
| 5,142,542 A | * | 8/1992 | Dixon | 372/22 |
| 5,363,390 A | | 11/1994 | Yang | 372/22 |
| 5,390,210 A | | 2/1995 | Fouquet | 372/92 |
| 5,408,110 A | | 4/1995 | Janz | 257/97 |
| 5,574,738 A | | 11/1996 | Morgan | 372/28 |
| 5,627,853 A | | 5/1997 | Mooradian | 372/92 |
| 5,918,108 A | * | 6/1999 | Peters | 438/29 |
| 5,991,318 A | | 11/1999 | Caprara | 372/22 |
| 6,097,742 A | * | 8/2000 | Caprara et al. | 372/22 |
| 6,167,068 A | | 12/2000 | Caprara | 372/22 |

OTHER PUBLICATIONS

W.J. Kozlovsky, W. Lenth, E.E. Latta, A. Moser and G.L. Bona, "Generation of 41 mW of Blue Radiation by Frequency Doubling of a GaAlAs Diode Laser," *Applied Physics Letters*, vol. 56, pp. 2291–2292, Jun. 4, 1990.

L. Goldberg, L.E. Busse and D. Mehuys, "High Power Continuous Wave Blue Light Generation in KNbO$_3$ Using Semiconductor Amplifier Seeded by a Laser Diode," *Applied Physics Letters*, vol. 63, pp. 2327–2329, Oct. 25, 1993.

W.J. Kozlovsky, W.P. Risk, W. Lenth, B.G. Kim, G.L. Bona, h. Jaeckel and D.J. Webb, "Blue Light Generation by Resonator–Enhanced Frequency Doubling of an Extended–Cavity Diode Laser," *Applied Physics Letters*, vol. 65, pp. 525–527, Aug. 1, 1994.

(List continued on next page.)

*Primary Examiner*—Paul Ip
*Assistant Examiner*—Davienne Monbleau
(74) *Attorney, Agent, or Firm*—John P. Hohimer

(57) ABSTRACT

A frequency-doubled semiconductor vertical-external-cavity surface-emitting laser (VECSEL) is disclosed for generating light at a wavelength in the range of 300–550 nanometers. The VECSEL includes a semiconductor multi-quantum-well active region that is electrically or optically pumped to generate lasing at a fundamental wavelength in the range of 600–1100 nanometers. An intracavity nonlinear frequency-doubling crystal then converts the fundamental lasing into a second-harmonic output beam. With optical pumping with 330 milliWatts from a semiconductor diode pump laser, about 5 milliWatts or more of blue light can be generated at 490 nm. The device has applications for high-density optical data storage and retrieval, laser printing, optical image projection, chemical-sensing, materials processing and optical metrology.

38 Claims, 4 Drawing Sheets

OTHER PUBLICATIONS

S. Nakagawa, N. Yamada, N. Mikoshiba and D.E. Mars, "Second–Harmonic Generation from GaAs/AlAs Vertical Cavity," *Applied Physics Letters*, vol. 66, pp. 2159–2161, Apr. 24, 1995.

N. Yamada, Y. Kaneko, S. Nakagawa, D.E. Mars, T. Takeuchi and N. Mikoshiba, "Continuous–Wave Operation of a Blue Vertical–Cavity Surface–Emitting Laser Based on Second–Harmonic Generation," *Applied Physics Letters*, vol. 68, pp. 1895–1897, Apr. 1, 1996.

N. Yamada, Y. Ichimura, S. Nakagawa, Y. Kaneko, T. Takeuchi and N. Mikoshiba, "Second–Harmonic Generation in Vertical–Cavity Surface–Emitting Laser," *Japanese Journal of Applied Physics*, vol. 35, pp. 2659–2663, May 1996.

P.A. Ramos and E. Towe, "Surface–Emitted Blue Light from [112]–Oriented (In,Ga)As/GaAs Quantum Well Edge–Emitting Lasers," *Applied Physics Letters*, vol. 69, pp. 3321–3323, Nov. 25, 1996.

M. Kuznetsov, F. Hakimi, R. Sprague and A. Mooradian, "High–Power (>0.5–W CW) Diode–Pumped Vertical–External–Cavity Surface–Emitting Semiconductor Lasers with Circular $TEM_{00}$ Beams," *IEEE Photonics Technology Letters*, vol. 9, pp. 1063–1065, Aug. 1997

M.H. Crawford, W.J. Alford, T.D. Raymond and A.A. Allerman, "Intra–Cavity Frequency Doubling of Vertical External Cavity Surface Emitting Lasers for Compact Milliwatt–Level Blue–Green Sources," Presented at the IEEE/LEOS '98 Annual Meeting, Orlando, FL, postdeadline paper PD1.4, Dec. 3, 1998.

M. Kuznetsov, F. Hakimi, R. Sprague, and A. Mooradian, "Design and Characteristics of High–Power (>0.5–W CW) Diode–Pumped Vertical–External–Cavity Surface–Emitting Semiconductor Lasers with Circular $TEM_{00}$ Beams," *IEEE Journal of Selected Topics in Quantum Electronics*, vol. 5, pp. 561–573, May/Jun. 1999.

T.D. Raymond, W.J. Alford, M.H. Crawford and A.A. Allerman, "Intracavity Frequency Doubling of a Diode–Pumped External–Cavity Surface–Emitting Semiconductor Laser," *Optics Letters*, vol. 24, pp. 1127–1129, Aug. 15, 1999.

M.A. Holm, D. Burns, P. Cusumano, A.I. Ferguson and M.D. Dawson, "High–Power Diode–Pumped AlGaAs Surface–Emitting Laser," *Applied Optics*, vol. 38, pp. 5781–5784, Sep. 20, 1999.

* cited by examiner

FREQUENCY-DOUBLED VERTICAL-EXTERNAL-CAVITY SURFACE-EMITTING LASER

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates generally to lasers and more particularly to a semiconductor vertical-external-cavity surface-emitting laser that generates second harmonic light by means of a nonlinear crystal contained within an optical cavity of the laser.

BACKGROUND OF THE INVENTION

Compact efficient sources of coherent blue or green laser light at wavelengths in the range of 400–550 nanometers are useful for many different types of applications including high-density optical data storage and retrieval, laser printing, optical image projection, fluorescence-based chemical-sensing, materials processing and optical metrology. Many different semiconductor laser approaches have been explored to generate lasing in this wavelength range, but with limited success and reliability. Prior approaches using external frequency doubling of semiconductor lasers have generated only a few nanoWatts of blue lasing. What is needed is a compact laser source which can generate light in the wavelength range of 400–550 nanometers at milliWatt output powers and with good beam quality.

The present invention overcomes the limitations of the prior art by providing a frequency-doubled vertical-external-cavity surface-emitting laser (VECSEL) which generates up to 5 milliWatts or more of lasing output at a wavelength below about 500 nanometers.

An advantage of the present invention is that the frequency-doubled VECSEL operates in a fundamental transverse mode to provide excellent focusability and beam propagation.

Yet another advantage of the present invention is that embodiments of the frequency-doubled VECSEL of the present invention can be activated either optically with an external laser pump energy source, or electrically by using current injection from an external power supply.

A further advantage of the present invention is that a precise wavelength control over a fundamental lasing frequency in the VECSEL can be provided during fabrication for precisely matching the fundamental frequency to be within an acceptance bandwidth of a particular nonlinear crystal to permit efficient frequency doubling and the generation of light at a predetermined wavelength.

Still another advantage of the present invention is that an air gap is provided between a gain element and a nonlinear crystal in the VECSEL; and this air gap permits the insertion of an optional Fabry-Perot etalon for reducing a bandwidth for lasing within the device, thereby improving the coherence and stability of the frequency-doubled lasing output.

These and other advantages of the present invention will become evident to those skilled in the art.

SUMMARY OF THE INVENTION

The present invention relates to an apparatus for generating light at a second-harmonic frequency. The apparatus comprises a semiconductor substrate which includes a first reflector formed on the substrate and a semiconductor active region formed on the substrate proximate to the first reflector; and a nonlinear crystal (e.g. potassium niobate) located proximate to the active region and spaced from the active region by an air gap (e.g. about 1–3 mm), with the nonlinear crystal having a second reflector on a surface thereof away from the active region. The first and second reflectors together define a laser cavity which contains the active region and the nonlinear crystal, with the active region generating lasing light at a fundamental frequency in response to electrical or optical activation, and with the nonlinear crystal converting a portion of the lasing light into light at the second-harmonic frequency. The second-harmonic lasing is emitted from the apparatus through the second reflector which is partially transmissive at the second-harmonic frequency.

The active region preferably comprises a plurality of quantum wells which can be gallium arsenide (GaAs) quantum wells, indium gallium arsenide (InGaAs) quantum wells, or aluminum gallium arsenide (AlGaAs) quantum wells depending upon the fundamental frequency which can be selected to correspond to a wavelength in the range of 600–1100 nanometers to generate light at a second-harmonic frequency that is at a wavelength equal to one-half the wavelength of the lasing at the fundamental frequency.

The first reflector is preferably a Distributed Bragg Reflector formed from a plurality of alternating high-refractive-index and low-refractive-index semiconductor layers epitaxially grown on the substrate to provide a reflectivity for light at the fundamental frequency of $\geq 99\%$. An optional third reflector can be epitaxially grown on the substrate above the active region, with the third reflector preferably being a Distributed Bragg Reflector formed from a plurality of alternating low-refractive-index and high-refractive-index semiconductor layers. The third reflector can help to control and stabilize the fundamental frequency for efficient second-harmonic light generation. An optional Fabry-Perot etalon can also be located within the air gap to narrow a bandwidth of the fundamental frequency for more efficient second-harmonic light generation and to provide a reduced bandwidth and increased coherence for the second-harmonic light.

The apparatus can be optically activated by pump light from a separate pump laser (e.g. a semiconductor laser or a titanium-sapphire laser). Alternately, the apparatus can be electrically activated by including a semiconductor p-n or p-i-n junction within the active region. For an electrically-activated device, an upper electrode can be provided above the active region, and a lower electrode can be provided on the substrate.

The present invention is further related to a semiconductor laser which comprises a gallium arsenide substrate having a plurality of III–V compound semiconductor layers epitaxially grown thereon, including a plurality of alternating high-refractive-index and low-refractive-index semiconductor layers forming a first reflector which is reflective of light at a fundamental frequency, and an active region wherein light is generated at the fundamental frequency; and a nonlinear crystal (e.g. potassium niobate) separated from the substrate and plurality of semiconductor layers by an air gap (e.g. a 1–3 mm air gap), with the nonlinear crystal having a first surface and a second surface, the first surface nearest the substrate generally being substantially planar and including an anti-reflection coating thereon, and the second surface preferably being curved (e.g. a 15-millimeter radius of curvature) and including a second reflector which is reflective of the light at the fundamental frequency and transmissive of light at a second-harmonic frequency that is twice the fundamental frequency. The first and second reflectors define therebetween a laser cavity that extends from the first reflector through the active region and the nonlinear crystal to the second reflector. The semiconductor laser of the present invention is responsive to an external energy source (e.g. optical or electrical activation) to generate light in the laser cavity at the fundamental frequency, with the nonlinear crystal being operative to convert the light at the fundamental frequency to light at the second-harmonic frequency, so that an output light beam (i.e. a lasing beam) is generated at the second-harmonic frequency and transmitted through the second reflector.

The first reflector, which preferably has a reflectivity for light at the fundamental frequency of >99%, can comprise, for example, gallium arsenide (GaAs) high-refractive-index layers and aluminum arsenide (AlAs) low-refractive-index layers. The second reflector is also preferably highly reflective at the fundamental frequency (e.g. $\geqq 99\%$), while being transmissive of the light generated at the second-harmonic frequency.

To generate blue light at a wavelength of about 490 nanometers corresponding to the second-harmonic frequency, the active region can comprise a plurality of alternating layers of tensile-strained gallium arsenide phosphide (GaAsP), compressively-strained indium gallium arsenide (InGaAs), and aluminum gallium arsenide (AlGaAs) to generate light at a fundamental wavelength of about 980 nanometers. In this preferred embodiment of the present invention, the GaAsP layers can have a semiconductor alloy composition $GaAs_{0.8}P_{0.2}$, the InGaAs layers can have the semiconductor alloy composition $In_{0.18}Ga_{0.82}As$, and the AlGaAs layers can have the semiconductor alloy composition $Al_{0.08}Ga_{0.92}As$. For this embodiment of the present invention, the active region can further include a carrier-confinement layer comprising aluminum gallium arsenide (AlGaAs), and an indium gallium phosphide (InGaP) cap layer overlying the AlGaAs current-confinement layer. In other embodiments of the present invention, the active region can comprise a plurality of alternating layers of gallium arsenide (GaAs) and aluminum gallium arsenide (AlGaAs) to generate a fundamental wavelength of about 860 nanometers which can be converted by the nonlinear crystal into blue light at a wavelength of about 430 nanometers. Other embodiments of the present invention can be formed with the semiconductor laser operating at a fundamental frequency corresponding to a wavelength in the range of 600–1100 nanometers for generation of a second-harmonic frequency corresponding to a wavelength in the range of 300–550 nanometers, with the second-harmonic wavelength being equal to one-half the fundamental wavelength.

Embodiments of the present invention can be provided for either optical activation or electrical activation. For optical activation, the external energy source can comprise optical pumping with lasing light from at least one pump laser, with the lasing light from each pump laser preferably being incident on the plurality of semiconductor layers at a Brewster angle which is defined by the refractive index of the active region. The Brewster angle can be, for example, about 74° as measured from an axis normal to an upper surface of the substrate. Each pump laser can comprise, for example, a semiconductor laser or a solid-state laser (e.g. a titanium-sapphire laser).

For electrical activation, the external energy source comprises electrical excitation with an electrical current flowing through a semiconductor p-n or p-i-n junction which can be formed about the active region by doping the plurality of semiconductor layers. An electrically-activated semiconductor laser also preferably includes an upper electrode above the active region and a lower electrode on the substrate. An electrically-activated semiconductor laser can also include an optional third reflector which can be epitaxially grown above the active region as a plurality of alternating low-refractive-index and high-refractive-index semiconductor layers that are reflective of the fundamental frequency. This third reflector can be used for wavelength control of the fundamental frequency for more efficient conversion of light at the fundamental frequency into light at the second-harmonic frequency.

An optional Fabry-Perot etalon can be located within the air gap of either an optically-activated device or an electrically-activated device to narrow the bandwidth of the fundamental frequency in the semiconductor laser.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
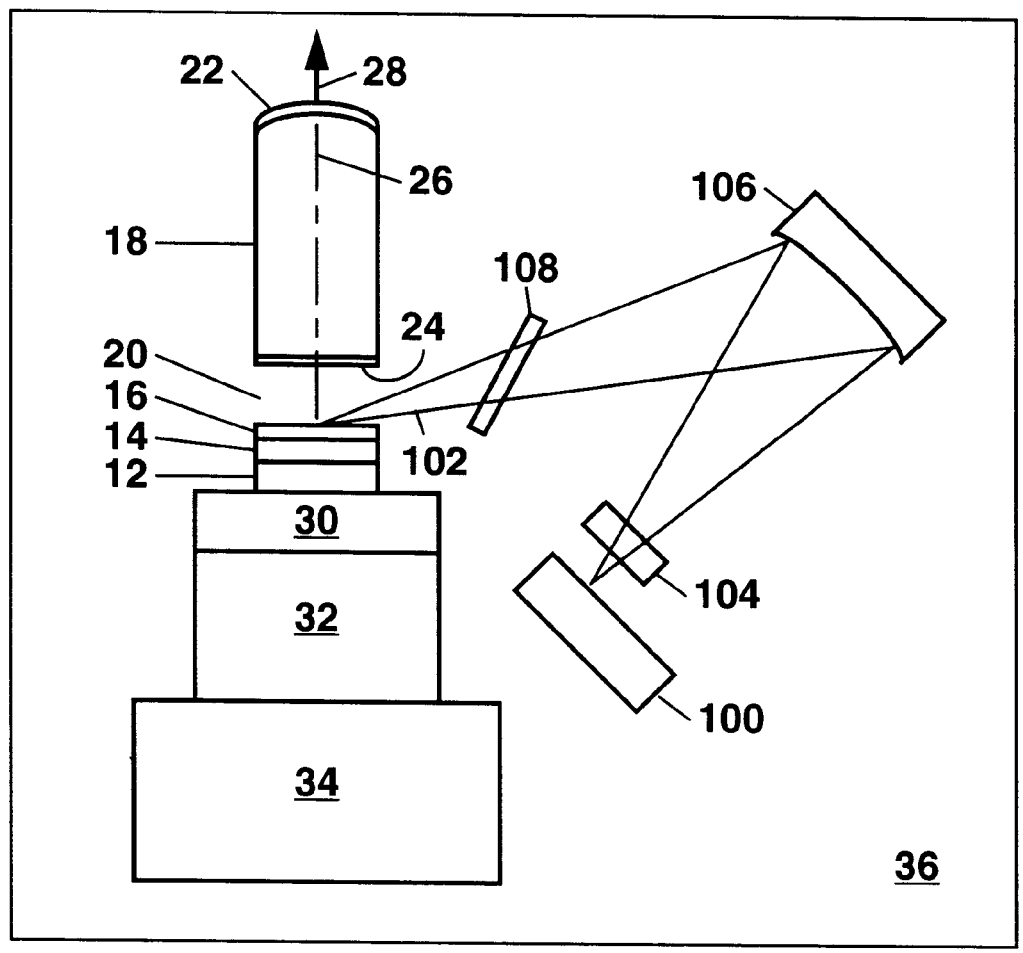
FIG. 1 shows schematically a first example of a frequency-doubled semiconductor laser formed according to the present invention with activation by optical pumping from an external pump laser.

Referring to FIG. 1, there is shown schematically a first example of a frequency-doubled semiconductor laser 10 formed according to the present invention. The semiconductor laser 10 is a vertical-external-cavity surface-emitting laser (VECSEL) which comprises a semiconductor substrate 12 with a first reflector 14 formed thereon and a semiconductor active region 16 formed on the substrate 12 above the first reflector 14. The semiconductor laser 10 further comprises a nonlinear crystal 18 located proximate to the active region 16 and separated from the active region 16 by an air gap 20 (i.e. the nonlinear crystal 18 is not affixed to the active region 16 or to any semiconductor layer epitaxially grown on the substrate 12).

In FIG. 1, the nonlinear crystal 18 further includes a second reflector 22 formed on a curved surface of the crystal 18 that is located distally to the active region 16, and an anti-reflection coating 24 which is provided on a generally planar surface of the crystal 18 that is located proximally to the active region 16. The first and second reflectors, 14 and 22, define a cavity of the semiconductor laser 10 that contains the active region 16, the nonlinear crystal 18 and the air gap 20.

The semiconductor laser 10 in the example of FIG. 1 can be optically activated by one or more external pump lasers 100 which can be, for example, semiconductor lasers. Each pump laser 100 generates a pump lasing beam 102 which is focused to be incident on the active region 16 at an angle, θ, which is preferably equal to Brewster's angle, $θ_B$, which is approximately equal to 74° as measured from an axis 26 that is normal to an upper surface of the substrate 12 (see FIG. 2). In general, Brewster's angle for a material of refractive index, n, is given by:

$$θ_B = \tan^{-1}(n)$$

and for a layered structure having an effective index of refraction, $n_{eff}$, averaged over a plurality of material layers, Brewster's angle is given by:

$$θ_B = \tan^{-1}(n_{eff})$$

where $n_{eff}$ is given by:

$$n_{eff} = \frac{\sum n_l t_l}{\sum t_l}$$

with $n_l$ being the refractive index of a particular layer, l, and $t_l$ being the thickness of that layer, l, and with the summation being performed over the plurality of material layers.

When the focused pump beam 102 is incident on the active region 16 at Brewster's angle as described above, the pump light is coupled into the active region 16 along the axis 26 to most effectively optically activate the active region 16 to generate light at the fundamental frequency. To reduce a reflection loss of the pump beam 102 at the surface of the active region 16, the pump beam 102 can be linearly polarized in a direction parallel to the plane containing the incident pump beam 102 and a reflected component of the pump beam 102 off the surface of the active region 16 (i.e. "p" polarization). If needed, a half-wave plate 104 can be inserted into the pump beam 102 as shown in FIG. 1 to rotate the polarization of the pump laser 100 to be in the preferred polarization direction.

In FIG. 1, a focusing mirror 106 (e.g. having a 25-mm radius of curvature), or alternately one or more refractive or diffractive lenses, can be used to focus the pump beam 102 down to a spot size of about 100 μm at the top of the active region 16. Additionally, a glass or fused silica plate 108 (e.g. 2 mm thick) can be inserted into the pump beam 102 at Brewster's angle to convert an elongated pump beam 102 from a semiconductor laser 100 (e.g. having a 1 μm×50 μm emitting region) into a circular focused beam at the location of the active region 16.

The incident pump beam 102 is absorbed in certain of the semiconductor layers forming the active region 16 thereby photogenerating electrons and holes which can then relax into other of the semiconductor layers (i.e. in a plurality of quantum wells) and recombine to generate light at a fundamental frequency of oscillation. This light at the fundamental frequency circulates within the cavity formed by the first and second reflectors, 14 and 22, and generates optical gain which can become sufficiently strong to overcome optical losses within the cavity formed by the first and second reflectors, 14 and 22, thereby producing lasing at the fundamental frequency within the semiconductor laser 10.

The nonlinear crystal 18 is preferably b-cut potassium niobate ($KNbO_3$) for operation at a fundamental wavelength near 980 nm or a-cut $KNbO_3$ for operation at a fundamental wavelength near 860 nm. Other nonlinear crystals can be used to frequency-double light at these wavelengths or at different wavelengths for operation of the semiconductor laser 10. The fundamental wavelength and fundamental frequency are inversely related so that these terms can be used interchangeably to describe the lasing within the cavity.

The nonlinear crystal 18 can have a length of several millimeters (e.g. 3.5–7.5 mm) and is oriented to provide non-critical phase matching at the fundamental frequency at a temperature near room temperature. In operation, the nonlinear crystal 18 acts to frequency double the lasing at the fundamental frequency and generate therefrom coherent light at a second-harmonic frequency which is twice the frequency, and hence one-half the wavelength, of the lasing at the fundamental frequency. The power of the second-harmonic lasing is proportional to the square of the power of the fundamental-frequency lasing circulating within the cavity formed by the first and second reflectors, 14 and 22. Due to the very high reflectivity (generally ≧99% and preferably ≧99.9%) of these reflectors 14 and 22 for light at the fundamental frequency, the circulating fundamental-frequency lasing power can be on the order of 10 Watts or more, thereby producing several milliWatts of second-harmonic lasing output from the device 10 in a second-harmonic output beam 28.

To provide for fundamental mode (i.e. $TEM_{00}$ mode) operation of the semiconductor laser 10 with a spot size about that of the focused pump beam 102 or slightly smaller, the nonlinear crystal 18 is preferably polished to provide a curved surface (e.g. a convex surface with a 15-mm radius of curvature) on an end thereof located away from the active region 16. A multi-layer dielectric mirror is deposited on the curved surface of the nonlinear crystal 18, with the mirror having a high reflectivity (e.g. >99.9%) at the fundamental frequency and a transmissivity of ≧50% and preferably as high as possible (e.g. 80–95%) at the second-harmonic frequency. The other end of the nonlinear crystal 18 located nearest to the active region 16 can be substantially planar and preferably includes a multi-layer anti-reflection coating 24 to provide a very low reflectivity (e.g. about 0.05% or less) at the fundamental frequency. In some embodiments of the present invention, the end of the nonlinear crystal 18 nearest the active region 16 can be curved for additional mode control and/or mode stability within the semiconductor laser 10.

Non-critical phase matching or quasi-phase matching within the nonlinear crystal 18 is advantageous since both result in substantially zero birefringent walk-off of beams at the fundamental and second-harmonic frequencies, thereby leading to a high energy conversion efficiency. A 7.5-mm-long b-cut $KNbO_3$ crystal 18 designed for Type 1 non-critical phase matching at 980 nanometers can be used according to the present invention, with this nonlinear crystal 18 having an acceptance angle of about 64 milliradians and an acceptance bandwidth of about 0.28 nanometers. This relative large acceptance angle permits angular alignment of the nonlinear crystal 18 with little effect on the conversion efficiency of the crystal 18.

When the nonlinear crystal 18 is spaced from the active region 16 by an air gap of generally 1–3 mm, a stable cavity is formed with lasing in the fundamental $TEM_{00}$ mode. The theoretical per-pass efficiency for generation of light at the second-harmonic frequency under optimal phase-matching conditions is calculated to be 1.6% per Watt of lasing power at the fundamental frequency circulating within the cavity formed by the first and second reflectors, 14 and 22.

Figure 2:
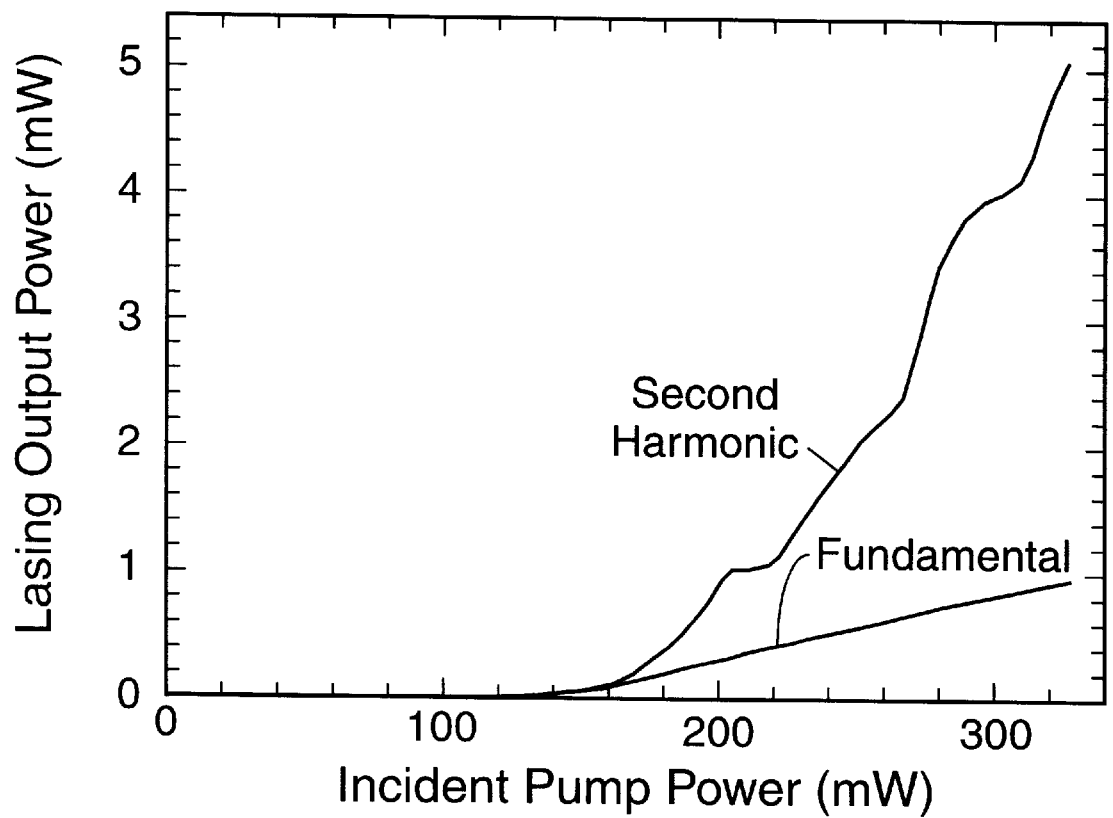
FIG. 2 shows curves of the lasing output from the frequency-doubled semiconductor laser of FIG. 1 at the fundamental and second-harmonic frequencies.

FIG. 2 shows the results for optical pumping of a semiconductor laser 10 with an active region 16 tailored for a fundamental lasing frequency of 980 nanometers. In FIG. 2, the threshold for lasing at the fundamental frequency is about 110 mW of incident power from a semiconductor diode pump laser 100. Above threshold, the second-harmonic output at 490 nanometers as measured through the second reflector 22 increases quadratically to 5 milliWatts as the incident pump power is increased to 330 milliWatts. The second-harmonic light is emitted through the second reflector 22 as a nearly-Gaussian coherent beam with an angular divergence of about 10 milliradians (full-width-at-half-maximum). Within the cavity formed by the first and second reflectors, 14 and 22, the circulating lasing power at the fundamental frequency (980 nm) is estimated to be about 3.4 Watts; and the low transmissivity (0.029%) of the second reflector 22 at the fundamental frequency allows a fundamental light output escaping the cavity through the second reflector 22 to be limited to only one-fifth the power in the second-harmonic output beam 28. If needed, the fundamental light output can be blocked with an optical filter, or separated from the second-harmonic output by a dispersive optical element (e.g. a prism or diffraction grating).

Returning to FIG. 1, the substrate 12 containing the first reflector 14 and the active region 16 can be mounted upon a heat sink 30 (e.g. comprising copper) for temperature control and cooling, with the heat sink 30 being further attached to a cold side of a Peltier cooling element 32 (i.e. a thermoelectric cooling element) to maintain the substrate 12 at a predetermined temperature (e.g. 0–20° C.). A secondary air-cooled or water-cooled heat sink 34 can be attached to a hot side of the Peltier element 32 for further heat removal.

Temperature control for the nonlinear crystal 18 can be optionally provided, if needed. This can be done, for example, by mounting the nonlinear crystal 18 on the same Peltier element (e.g. using a heat sink 30 which is common to both the substrate 12 and the crystal 18), on a different Peltier element (to allow the substrate 12 and the nonlinear crystal 18 to be independently temperature controlled), or in a temperature-controlled oven (to allow heating of the nonlinear crystal 18 to a temperature slightly above room temperature).

In FIG. 1, the entire semiconductor laser 10 including the semiconductor diode pump laser 100 can be mounted on a base 36 to form a compact package with lateral dimensions of a few centimeters. In other embodiments of the present invention, multiple semiconductor diode pump lasers 100 (e.g. single-stripe diode lasers or diode laser arrays) can be used spaced about the active region 16 to provide a plurality of focused pump beams 102 which can all be made coincident on the active region 16 to obtain an increased pump power level to generate a higher level of second-harmonic light from the semiconductor laser 10. Alternately, a pump laser 100 in the form of a solid-state laser (e.g. a titanium-sapphire laser) can be used to optically activate the semiconductor laser 10 of the present invention.

Figure 3:
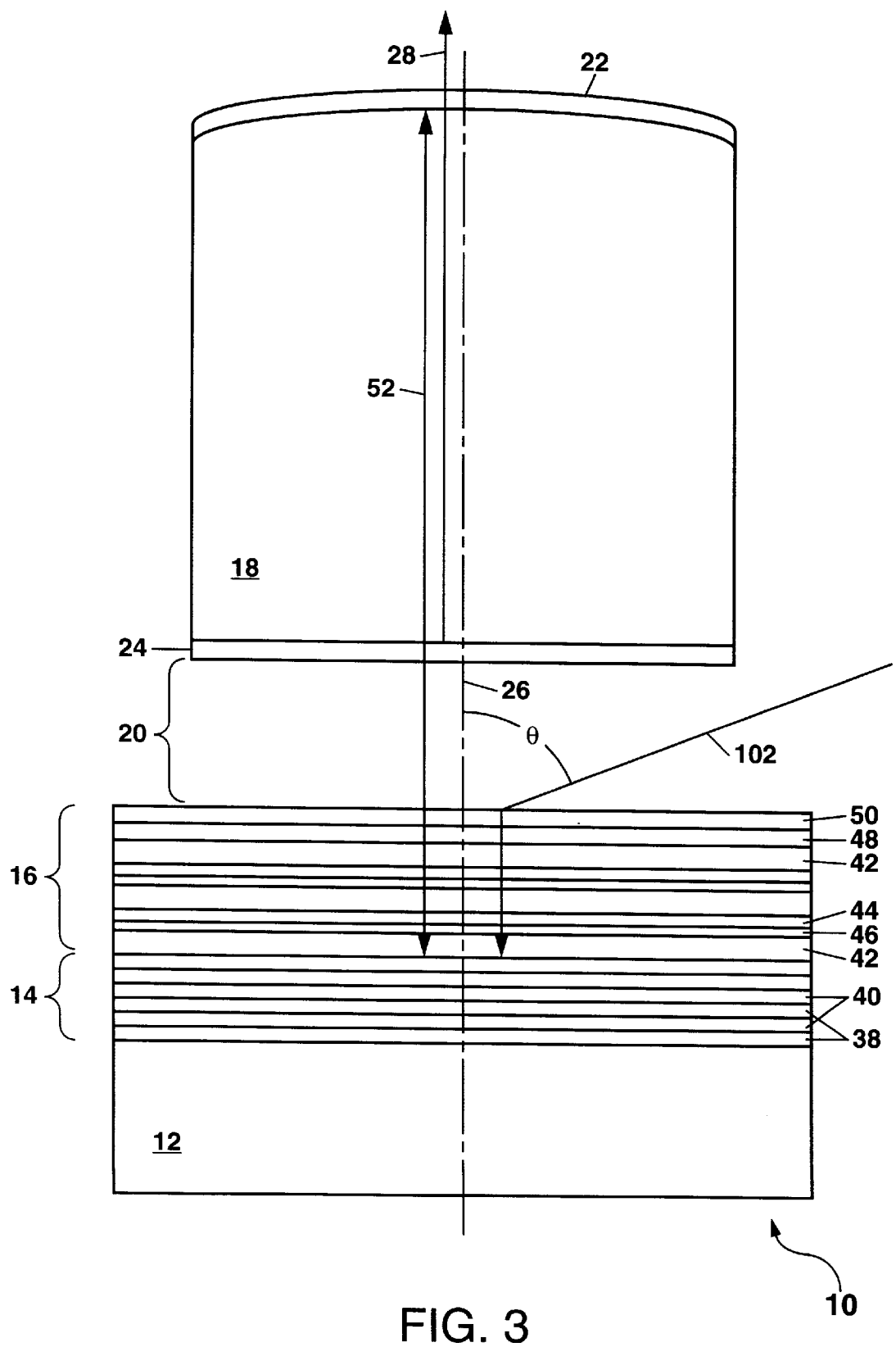
FIG. 3 schematically illustrates in cross-section view the frequency-doubled semiconductor laser of FIG. 1.

FIG. 9 shows further details of the structure of the semiconductor laser 10 in the example of FIG. 1. In FIG. 3, the substrate 12 comprises a III–V compound semiconductor, preferably gallium arsenide (GaAs). The GaAs substrate 12 can be about 0.65 mm thick with a crystallographic orientation that is about 2° off the (100) crystallographic plane towards the (110) plane, and can further include one or more buffer layers of GaAs (not shown in FIG. 3) that are epitaxially grown on the substrate 12 to prepare the substrate for further epitaxial growth. The plurality of III–V compound semiconductor layers epitaxially grown on the substrate 12 to form the first reflector 14 and the active region 16 can be grown by a conventional epitaxial growth method such as molecular beam epitaxy (MBE) or metal-organic chemical vapor deposition (MOCVD).

In FIG. 3, the first reflector 14 is a Distributed Bragg Reflector (DBR) which comprises a plurality of alternating high-refractive-index semiconductor layers 38 and low-refractive-index semiconductor layers 40, with each layer 38 and 40 having a layer thickness of substantially one-quarter wavelength of the light at the fundamental frequency. For a fundamental wavelength of 980 nm, the high-refractive-index semiconductor layers 38 can comprise GaAs with a layer thickness of 68–70 nm epitaxially grown (e.g. by MOCVD) at a temperature of about 750° C.; and the low-refractive-index semiconductor layers 40 can comprise aluminum arsenide (AlAs) with a layer thickness of 81–83 nm epitaxially grown at the same temperature. Twenty seven pairs of high-refractive-index and low-refractive-index semiconductor layers, 38 and 40, can be used to provide a reflectivity of >99.9% at the fundamental wavelength of 980 nm. In other embodiments of the present invention, the exact number of pairs of the high-refractive-index and low-refractive-index semiconductor layers, 38 and 40, will depend upon the fundamental frequency, the desired reflectivity at the fundamental frequency and the semiconductor alloy composition of the layers 38 and 40 (i.e. a refractive index difference between the layers 38 and 40).

In FIG. 3, the active region 16 is epitaxially grown above the first reflector 14 and comprises a plurality of pump-light-absorbing layers 42 separated by quantum wells 44. The pump-light-absorbing layers 42 have an energy bandgap that is larger than the energy bandgap of the quantum wells 44 so that carriers (i.e. electrons and holes) photogenerated by the incident pump beam 102 will be captured by the quantum wells 44 where the electrons and holes can recombine to generate light at the fundamental frequency. For a fundamental frequency of 980 nm, the pump-light-absorbing layers 42 can comprise, for example, about 125 nm of $Al_{0.08}Ga_{0.92}As$ for absorbing an incident pump beam 102 at a wavelength near 800 nm. The $Al_{0.08}Ga_{0.92}As$ pump-light-absorbing layers 42 can be epitaxially grown by MOCVD at a temperature of about 620° C.

For operation at 980 nm, the quantum wells 44 can comprise about 10 nm of indium gallium arsenide with the composition $In_xGa_{1-x}As$ with x being in the range of 0.16–0.18. The $In_xGa_{1-x}As$ quantum wells 44 can be epitaxially grown by MOCVD at about 620° C. Since the $In_{0.18}Ga_{0.82}As$ quantum wells 44 are compressively strained, a strain-compensation layer comprising, for example, a 9-nm-thick layer of tensile-strained gallium arsenide phosphide with the composition $GaAs_{0.80}P_{0.20}$ can be epitaxially grown on one side of each $In_{0.18}Ga_{0.82}As$ quantum well 44 to provide a strain balanced structure for the active region 16. The quantum wells 44 are also preferably spaced to coincide with anitnodes (i.e. peaks) of a standing-wave electric field of the lasing at the fundamental frequency within the cavity formed by the reflectors 14 and 22. About 10–15 quantum wells 44 are generally provided in the active region 16.

In FIG. 3, a carrier-confinement layer 48 is preferably epitaxially grown above a last-grown pump-light-absorbing layer 42 to prevent the carriers from escaping to the upper surface of the active region 16 where surface recombination can occur. The carrier-confinement layer 48, which has an energy bandgap larger than the energy bandgap of the pump-light-absorbing layers 42, can comprise, for example, an $Al_{0.5}Ga_{0.5}As$ layer that is about 100 nanometers thick grown by MOCVD at a temperature of about 750° C. To prevent oxidation of the aluminum in the $Al_{0.5}Ga_{0.5}As$ carrier-confinement layer 48, a cap layer 50 of indium gallium phosphide with a lattice-matched composition $In_{0.49}Ga_{0.51}As$ and a layer thickness of about 40 nanometers can be epitaxially grown above the carrier-confinement layer 48 by MOCVD at a temperature of about 620° C. For optical activation of the semiconductor laser 10, none of the plurality of epitaxially-grown semiconductor layers need be doped.

After the epitaxial growth is complete, the substrate 12 can be cleaved to a predetermined size (e.g. up to a few millimeters on a side) and mounted for optical pumping as shown in FIG. 1. It is not necessary to remove the substrate 12 since the semiconductor laser 10 can be effectively heat-sinked through the substrate 12. To further enhance heat removal through the substrate 12 and improve device performance, the substrate can be thinned (e.g. to about 100–200 μm thickness).

With optical activation, the semiconductor laser 10 lases at the fundamental frequency producing a fundamental beam 52 as shown in FIG. 3 which circulates in the cavity formed by the first and second reflectors, 14 and 22. The nonlinear crystal 18 then operates to convert a portion of the fundamental beam 52 into a second-harmonic beam 28 which exits the semiconductor laser 10 by being transmitted through the second reflector 22. The beams 28 and 52 overlap spatially and are centered about the axis 26 coincident with focused pump beam 102 which is directed into the active region 16 along the axis 26. However, for clarity, each of the beams 28, 52 and 102 are shown displaced slightly from the axis 26 and from each other in FIG. 3.

Figure 4:
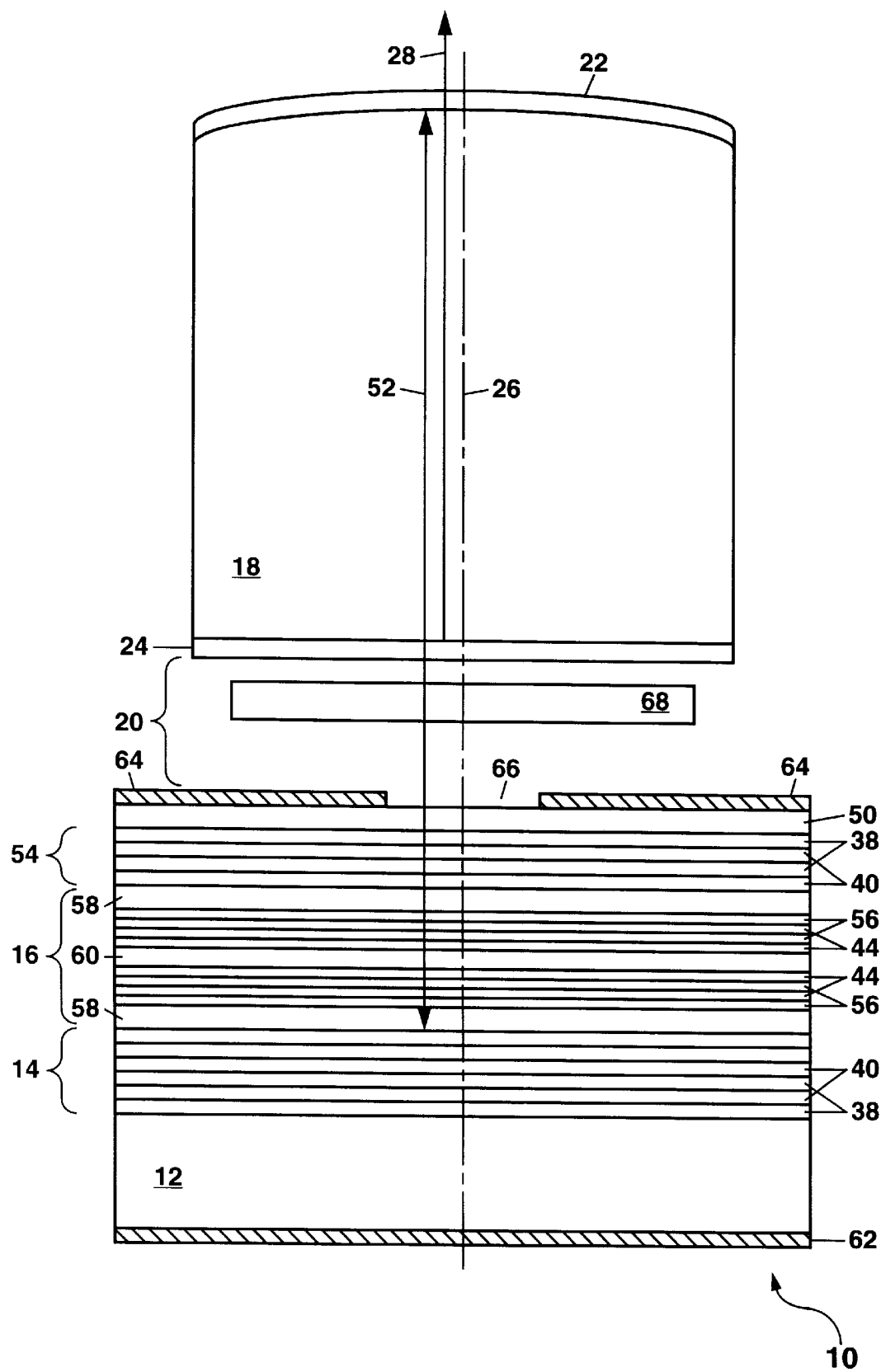
FIG. 4 schematically illustrates in cross-section view a second example of a frequency-doubled semiconductor laser formed according to the present invention with activation by an electrical current.

FIG. 4 schematically illustrates in cross-section view a second example of a frequency-doubled semiconductor laser 10 formed according to the present invention with activation by an electrical current flowing through the active region 16. The example of the semiconductor laser 10 in FIG. 4 will be described in terms of a device 10 operating at a fundamental frequency corresponding to a wavelength of about 860 nm although it will be understood by those skilled in the art that electrically-activated semiconductor lasers 10 can be formed according to the present invention to operate at other fundamental wavelengths generally within the wavelength range of 600–1100 nm. In FIG. 4, the nonlinear crystal 18 preferably comprises an a-cut $KNbO_3$ crystal. The size of the nonlinear crystal 18 is similar to that described previously with reference to FIGS. 1–3, with the anti-reflection coating 24 being tailored to provide a very low reflectivity at 860 nm (e.g. $\leq 0.05\%$ reflectivity), and with the second reflector 22 providing a very high reflectivity ($\geq 99\%$ and preferably >99.9%) at the fundamental wavelength of 860 nm and a high transmissivity ($\geq 50\%$ and preferably 80–95%) for the generated second-harmonic beam 28.

In the example of FIG. 4, the substrate 12 preferably comprises a p-doped GaAs substrate having a p-type dopant concentration of about $10^{18}$ $cm^{-3}$. Upon the substrate 12 are epitaxially grown a plurality of doped semiconductor layers to form the first reflector 14, the active region 16 and a third reflector 54. The use of a p-type substrate allows the semiconductor layers epitaxially grown in an upper portion of the active region 16 or thereabove to be n-type doped thereby providing an increased carrier mobility in these layers (due to electrons being the majority carriers) to provide a more uniform electrical activation of the active region 16 in the device 10. In other embodiments of the present invention, an n-type substrate 12 can be used, with the polarity of the various semiconductor layers in FIG. 4 being reversed.

In the example of FIG. 4, the first reflector 14 can be formed from a plurality of alternating high-refractive-index semiconductor layers 38 and low-refractive-index semiconductor layers 40 as described previously with reference to FIG. 3. For operation at an 860-nm fundamental wavelength, the high-refractive-index layers 38 can comprise, for example, 36.9 nm of $Al_{0.16}Ga_{0.84}As$ epitaxially grown by MOCVD at about 750° C.; and the low-refractive-index layers 40 can comprise, for example, 42.6 nm of $Al_{0.92}Ga_{0.08}As$ grown by MOCVD at the same temperature. Compositionally-graded interfaces (i.e. graded in composition between $Al_{0.16}Ga_{0.84}As$ and $Al_{0.92}Ga_{0.08}As$) about 26.5 nm thick can be provided between each adjacent pair of the layers 38 and 40 to reduce the electrical resistance of the first reflector 14. A total of thirty five pairs of layers 38 and 40 can be used to provide the desired high reflectivity of $\geq 99.9\%$. All of the pairs of the layers 38 and 40 in the first reflector 14 when grown on a p-type-doped substrate 12 can also be doped p-type to about $3\times10^{18}$ $cm^{-3}$ with carbon, with a last-grown pair of the layers 38 and 40 having a reduced p-type doping level (e.g. $1\times10^{18}$ $cm^{-3}$).

In FIG. 4, the active region 16 that is epitaxially grown above the first reflector 14 can comprise a plurality of GaAs quantum wells 44 separated by higher-bandgap AlGaAs (e.g. $Al_{0.15}Ga_{0.85}As$) barrier layers 56, with the quantum wells 44 and barrier layers 56 further being sandwiched between a pair of graded-index cladding layers 58 having an even higher energy bandgap. A spacer layer 60 about 20 nanometers thick and having the same semiconductor alloy composition as the barrier layers 56 can be located at the position of a node (i.e. a null) in the electrical field of the lasing at the fundamental frequency, with the node preferably being located at the center of the active region 16. The plurality of quantum wells 44, barrier layers 56 and the spacer layer 60 in the example of FIG. 4 can have a combined layer thickness that results in an effective optical thickness of these layers which is substantially equal to one wavelength of the light at the fundamental-frequency.

In FIG. 4, the GaAs quantum wells 44 can be, for example, 6–12 nanometers thick, with the AlGaAs barrier layers being, for example, 8 nanometers thick. The quantum wells 44 and barrier layers 56 are preferably undoped (i.e. not intentionally doped) to form a p-i-n junction about the active region 16. The active region 16 can include, for example, ten quantum wells 44 separated into two sets of five quantum wells 44 by the spacer layer 60 to spread the gain in the active region 16 over one wavelength of the light at 860 nm.

In FIG. 4, the cladding layers 58 are preferably graded in composition between the semiconductor alloy composition of the low-refractive-index layers 40 (e.g. $Al_{0.92}Ga_{0.08}As$) and the composition of the barrier layers 56 (e.g. $Al_{0.15}Ga_{0.85}As$) over an effective optical thickness of about one-half wavelength of the light at the fundamental frequency. The "effective optical thickness" of a layer of refractive index, n, and actual layer thickness, L, is defined herein to be the product of the refractive index and the actual layer thickness (i.e. nL). For a layer that is graded in composition (and hence in refractive index, n), an integral of the product nL can be taken over the layer thickness L to determine the effective optical thickness for the graded layer. Finally, for a plurality of layers of different composition and actual layer thicknesses, the effective optical thickness for the totality of the layers can be determined by taking a sum of the effective optical thickness for each layer.

The composition grading of the above cladding layers 58 during epitaxial growth can also be combined with a step grading of the doping concentration in the cladding layers 58 from about $1 \times 10^{18}$ cm$^{-3}$ furtherest from the undoped quantum wells 44 to about $2 \times 10^{17}$ cm$^{-3}$ nearest to the quantum wells 44. A first-grown cladding layer 58 adjacent to the first reflector 14 is p-typed doped when the substrate 12 and the first reflector 14 are p-type doped; and a second-grown cladding layer 58 above the quantum wells 44 is oppositely doped (e.g. n-type doped with silicon). This doping arrangement in the active region 16 forms a semiconductor p-i-n junction about the active region 16. In other embodiments of the present invention, a semiconductor p-n junction can be formed with the n-type and p-type doping extending into a central portion of the active region 16 containing the quantum wells 44 and barrier layers 56.

In the example of FIG. 4, an optional third reflector 54 can be epitaxially grown above the active region 16 to aid in controlling and stabilizing the fundamental frequency of lasing within the semiconductor laser 10. The inclusion of the third reflector 54 is advantageous since the conversion of the fundamental-frequency lasing into the second-harmonic output beam 28 can introduce a wavelength-dependent loss into the cavity which can result in the lasing in the cavity being shifted in wavelength away from the fundamental frequency and beyond the acceptance bandwidth of the nonlinear crystal 18, thereby lowering the conversion efficiency in the laser 10.

The third reflector 54 can be formed similarly to the first reflector 14 except that the third reflector 54 is formed as a mirror image of the first reflector 14 as shown in FIG. 4 and contains a smaller number (e.g. 7–10) of pairs of alternating low-refractive-index layers 40 and high-refractive-index layers 38 to provide a reflectivity of generally only about 80–90%. This lower reflectivity of the third reflector 54 prevents lasing in a cavity formed by the first and third reflectors, 14 and 54, and instead encourages the semiconductor laser 10 to lase in the cavity formed by the first and second reflectors, 14 and 22. Additionally, the third reflector 54 is doped oppositely from the first reflector 14, and generally with a slightly lower doping level (e.g. $1 \times 10^{18}$ cm$^{-3}$ n-type doping with silicon).

In FIG. 4, a cap layer 50 is epitaxially grown above the third reflector 54. The cap layer 50 can comprise, for example, about 110 nm of $Al_{0.16}Ga_{0.84}As$ with a relatively high n-type doping level of $4 \times 10^{18}$ cm$^{-3}$ silicon followed by the growth of about 12 nm of GaAs identically doped. Both the $Al_{0.16}Ga_{0.84}As$ and GaAs can be epitaxially grown by MOCVD at about 750° C. The relatively high doping in the cap layer 50 is advantageous for forming an Ohmic contact (i.e. an upper electrode 64) to the cap layer 50 and also facilitates current spreading in the cap layer 50 to provide a more uniform electrical current distribution over the ~100 µm lasing mode spot size for efficient generation of optical gain and lasing at the fundamental frequency. The use of an n-type doping for the third reflector 54, which is made possible by growing the plurality of semiconductor layers on a p-type substrate 12, further facilitates the current spreading since the mobility of electrons provided by the n-type doping exceeds that of holes produced by p-type doping. Carrier trapping at heterointerfaces between the alternating low-refractive-index layers 40 and high-refractive-index layers 38 in the third reflector 54 also aids in promoting lateral current spreading.

In other embodiments of the present invention in which the third reflector 54 is omitted, one or more current-spreading layers can be provided in or above the active region 16 to promote current spreading in order to provide a more uniform electrical current distribution over the width of the fundamental lasing mode. Such a current-spreading layer can be, for example, a relatively thick (e.g. about 3-µm thick) bulk layer of GaAs or AlGaAs epitaxially grown above the active region 16 with at least a part of the bulk layer being heavily doped (e.g. n-type doped to about $4 \times 10^{18}$ cm$^{-3}$). Alternately, one or more heavily-doped semiconductor, metal or semimetal sheets can be located at nodes of the electric field within or above the active region 16 to enhance lateral current spreading. As an example, the heavily-doped semiconductor sheets can be formed by three 30-nm-thick layers of $Al_{0.1}Ga_{0.9}As$ with an n-type doping level of $4 \times 10^{18}$ cm$^{-3}$ epitaxially grown above the active region 16, with adjacent of the heavily-doped semiconductor sheets being separated by 380-nm-thick spacer layers of $Al_{0.8}Ga_{0.2}As$ having a lower doping level (e.g. about $5 \times 10^{17}$ cm$^{-3}$). Another method for improving the lateral current spreading in the semiconductor laser 10 is to provide barriers to vertical carrier transport above the active region 16 and thereby promote lateral current spreading. Such vertical-transport barriers can be formed, for example, from high-bandgap layers (e.g. 35-nm layers of $Al_{0.8}Ga_{0.2}As$ n-type doped to about $1 \times 10^{18}$ cm$^{-3}$) alternated with low-bandgap layers (e.g. 330-nm layers of $Al_{0.1}Ga_{0.9}As$ n-type doped to about $5 \times 10^{17}$ cm$^{-3}$). A total of three vertical-transport barriers can be provided above the active region 16 with an overall layer thickness of about 1.2 µm.

After epitaxial growth of the semiconductor layers on the substrate 12, a pair of electrodes can be formed about the active region for connection to an electrical current source (e.g. a power supply). These electrodes can include a lower electrode 62 formed on the substrate 12 (e.g. on a bottom surface of the substrate 12) and an upper electrode 64 formed above the active region 16 and overlying the cap layer 50. The electrodes 62 and 64 can be conventionally formed with the lower electrode 62 comprising, for example, a full-surface metallization of Ti/Pt/Au or Be/Au; and with the upper electrode 64 comprising, for example, a patterned metallization of Au/Ge/Ni with a shaped opening 66 (e.g. circular) formed therethrough by photolithographic masking and lift-off for transmission of the lasing at the fundamental frequency the electrodes 62 and 64 can be annealed (e.g. at 350° C. for 30 seconds in a rapid thermal annealer) to reduce contact resistance. Alternately, the upper electrode 64 can comprise a transparent indium-tin-oxide electrode so that no shaped opening 66 need be formed. The substrate 12 can be optionally thinned to about 100–200 µm prior to depositing the lower electrode 62.

Restricting the electrical current to flow through a central portion of the active region 16 centered about the axis 28 can be achieved by several methods as known to the art. For example, ion implantation (e.g. with hydrogen or oxygen ions) can be used to increase the resistivity of the cap layer 50 and the uppermost few layers 38 and 40 of the third reflector 54 at a predetermined distance from the axis 28 that exceeds the size of the shaped opening 66.

Alternately, selective lateral oxidation of an AlGaAs portion of the cap layer 50 or one or more aluminum-containing layers (e.g. comprising AlGaAs or AlAs) in the third reflector 54 can be used to generate electrically insulative regions to channel the electrical current into the active region 16. The AlGaAs portion of the cap layer 50 can be oxidized by etching downward through a GaAs portion of the cap layer 50 to expose the AlGaAs portion and then exposing the AlGaAs portion to a moist ambient at a substrate temperature of about 350 to 500° C. (and preferably between about 400 and 450° C.). The moist ambient can be generated, for example, by flowing a gas, such as nitrogen, through water heated to about 80–95° C. to entrain water vapor, and then directing the moisture-laden gas into a container containing the heated substrate 12. Exposure of the heated substrate 12 and AlGaAs portion of the cap layer 50 to the moist ambient for about one-half hour or less locally converts the AlGaAs portion into an oxide of aluminum which is an electrical insulator.

In yet another method for channeling the electrical current into the active region 16, a trench can be etched downward partway into the third reflector 54 to expose sidewalls of the trench formed of the AlAs or AlGaAs low-refractive-index layers 40 and GaAs high-refractive-index layers 38. The oxidation process in this case can proceed laterally inward over time to oxidize the AlAs or AlGaAs low-refractive-index layers 40 and to convert these layers 40 into an oxide of aluminum while the GaAs high-refractive-index layers 38 remain unchanged. The exact time required for this lateral oxidation process is highly temperature sensitive and can be in the range of about 0.5–2.5 hours for an oxidation distance of 50 $\mu$m at a substrate temperature of in the range of 400–450° C.

After deposition of the electrodes 62 and 64, the substrate 12 can be diced or cleaved to dimensions about one millimeter on a side and mounted substrate-side-down on a Peltier cooler for heat removal during operation. The nonlinear crystal 18 with its integral second reflector 22 can then be brought into alignment with the first reflector 14 on the substrate 12 to form the completed laser cavity. The electrical injection of current from a source through the semiconductor p-n or p-i-n junction in the device 10 via electrodes 62 and 64 can produce lasing at the fundamental frequency which is then converted into the second-harmonic output beam 28 by action of the nonlinear crystal 18. The electrically-injected semiconductor laser 10 can be operated either in a pulsed mode or continuously depending upon whether a current pulse or a direct-current (d-c) current is supplied to the device 10. One- or two-dimensional arrays of electrically-activated semiconductor lasers 10 can be formed according to the present invention, with the individual lasers 10 in the array being electrically activated individually, or in tandem.

In some embodiments of the present invention as shown in FIG. 4, an optional Fabry-Perot etalon 68 (e.g. about 100 $\mu$m thick) can be located within the air gap 20 to narrow the bandwidth of the lasing at the fundamental frequency and thereby produce lasing on a single longitudinal mode (i.e. single-frequency lasing) within the cavity formed by the first and second reflectors 14 and 22. This is advantageous for narrowing the bandwidth of the second-harmonic output beam 28 and thereby increasing a coherence length and stability of the second-harmonic beam 28. Additionally, this can reduce the bandwidth of the fundamental-frequency lasing to be within the acceptance bandwidth of the nonlinear crystal 18, thereby enabling the nonlinear crystal 18 to more efficiently frequency-double the fundamental beam 52.

Other embodiments of the present invention are possible. For example, a third reflector 54 can be incorporated into an optically-activated semiconductor laser 10 above the active region 16 to provide control over the wavelength of the fundamental beam 52 and thereby aid in maintaining the fundamental frequency within the acceptance bandwidth of the nonlinear crystal 18. The third reflector 54 can be epitaxially grown using a plurality of alternating low-refractive-index semiconductor layers 40 and high-refractive-index semiconductor layers 38. Doping of the layers 38 and 40 in the third reflector 54 is not necessary for an optically-activated semiconductor laser 10. Alternately, a third reflector 54 can be deposited after epitaxial growth using, for example, a plurality of alternating layers of silicon dioxide ($SiO_2$) to form the low-refractive-index layers 40 and titanium dioxide ($TiO_2$) to form the high-refractive-index layers 38.

Efficient optical pumping of the active region 16 in an optically-activated semiconductor laser 10 having a third reflector 54 is possible since the third reflector 54 can be made highly transmissive (e.g. $\geq 90\%$) at the wavelength of the focused pump beam 102, while at the same time being highly reflective (e.g. 80–90%) at the fundamental wavelength. The use of a third reflector 54 in an optically activated semiconductor laser 10 is also advantageous since this allows the fundamental frequency to be tuned slightly during fabrication of the device 10 to a particular wavelength desired for generation of the second-harmonic output beam 28 or to a wavelength that is optimum for a particular nonlinear crystal 18 (i.e. within the acceptance bandwidth for that crystal 18). Such wavelength tuning can be accomplished, for example, by etching away a portion of one or more of the uppermost layers 38 and 40 of the third reflector 54.

Additionally, embodiments of the semiconductor laser 10 of the present invention can be fabricated for operation at wavelengths other than those described above. For example, operation at a fundamental wavelength of 780 nm is possible using AlGaAs quantum wells 44. Such a device 10 can generate a 390-nm second-harmonic output beam 22 with either electrical or optical activation. In this case, a periodically-poled potassium titanyl phosphate ($KTiOPO_4$ also termed KTP) nonlinear crystal 18 can be used. As another example, operation at a fundamental wavelength of 680 nm is possible using InGaP or indium aluminum gallium phosphide (InAlGaP) quantum wells 44 and a periodically-poled lithium tantalate ($LiTaO_3$) nonlinear crystal 18. Other embodiments of the present invention can be fabricated using quantum wells of indium gallium arsenide phosphide (InGaAsP), indium gallium arsenide nitride (InGaAsN), gallium arsenide antimonide (GaAsSb) or gallium arsenide antimonide nitride (GaAsSbN). Additionally, embodiments of the present invention can be formed on other types of semiconductor substrates, including indium phosphide (InP) substrates.

The matter set forth in the foregoing description and accompanying drawings is offered by way of illustration only and not as a limitation. Other applications and variations of the present invention will become evident to those skilled in the art. The actual scope of the invention is intended to be defined in the following claims when viewed in their proper perspective based on the prior art.

What is claimed is:

1. An apparatus for generating light at a second-harmonic frequency, comprising:

(a) a semiconductor substrate including a first reflector formed thereon and a semiconductor active region formed on the substrate above the first reflector; and (b) a nonlinear crystal located proximate to the active region and spaced therefrom by an air gap, with the nonlinear crystal including a second reflector on a surface thereof away from the active region, the first and second reflectors defining therebetween a laser cavity containing the active region and the nonlinear crystal, with the active region generating lasing light at a fundamental frequency in response to electrical or optical activation, and with the nonlinear crystal converting a portion of the lasing light into light at the second-harmonic frequency.

2. The apparatus of claim 1 wherein the active region comprises a plurality of quantum wells.

3. The apparatus of claim 2 wherein the quantum wells are selected from the group consisting of gallium arsenide (GaAs) quantum wells, indium gallium arsenide (InGaAs) quantum wells, and aluminum gallium arsenide (AlGaAs) quantum wells.

4. The apparatus of claim 2 wherein the active region further includes a semiconductor p-n or p-i-n junction.

5. The apparatus of claim 4 further including an upper electrode above the active region and a lower electrode on the substrate.

6. The apparatus of claim 1 wherein the first reflector is a Distributed Bragg Reflector formed from a plurality of alternating high-refractive-index and low-refractive-index semiconductor layers epitaxially grown on the substrate.

7. The apparatus of claim 6 wherein the first reflector has a reflectivity for light at the fundamental frequency of >99%.

8. The apparatus of claim 1 further including a third reflector epitaxially grown on the substrate above the active region.

9. The apparatus of claim 8 wherein the third reflector is a Distributed Bragg Reflector formed from a plurality of alternating low-refractive-index and high-refractive-index semiconductor layers.

10. The apparatus of claim 1 further including a Fabry-Perot etalon located within the air gap to narrow a bandwidth of the fundamental frequency.

11. The apparatus of claim 1 wherein the nonlinear crystal comprises potassium niobate ($KNbO_3$).

12. The apparatus of claim 1 wherein the fundamental frequency corresponds to a wavelength in the range of 600–1100 nanometers, and the second-harmonic frequency corresponds to a wavelength in the range of 300–550 nanometers.

13. The apparatus of claim 1 wherein the air gap is 1–3 millimeters thick.

14. A semiconductor laser, comprising:
  (a) a gallium arsenide substrate having a plurality of III–V compound semiconductor layers epitaxially grown thereon, including a plurality of alternating high-refractive-index and low-refractive-index semiconductor layers forming a first reflector which is reflective of light at a fundamental frequency, and an active region wherein light is generated at the fundamental frequency; and
  (b) a nonlinear crystal separated from the substrate and plurality of semiconductor layers by an air gap, the nonlinear crystal having a first surface and a second surface, with the first surface nearest the substrate including an anti-reflection coating thereon, and with the second surface being curved and including a second reflector which is reflective of the light at the fundamental frequency and transmissive of light at a second-harmonic frequency that is twice the fundamental frequency, the first and second reflectors defining therebetween a laser cavity that extends from the first reflector through the active region and the nonlinear crystal to the second reflector, with the laser being responsive to an external energy source to generate light in the laser cavity at the fundamental frequency, and with the nonlinear crystal being operative to convert the light at the fundamental frequency to light at the second-harmonic frequency, thereby generating an output light beam at the second-harmonic frequency through the second reflector.

15. The semiconductor laser of claim 14 wherein the high-refractive-index layers comprise gallium arsenide, and the low-refractive-index layers comprise aluminum arsenide.

16. The semiconductor laser of claim 14 wherein the first reflector has a reflectivity for light at the fundamental frequency of $\geq 99\%$.

17. The semiconductor laser of claim 14 wherein the active region comprises a plurality of alternating layers of tensile-strained gallium arsenide phosphide (GaAsP), compressively-strained indium gallium arsenide (InGaAs), and aluminum gallium arsenide (AlGaAs).

18. The semiconductor laser of claim 17 wherein the GaAsP layers have a semiconductor alloy composition $GaAs_{0.8}P_{0.2}$, the InGaAs layers have the semiconductor alloy composition $In_{0.18}Ga_{0.82}As$, and the AlGaAs layers have the semiconductor alloy composition $Al_{0.08}Ga_{0.92}As$.

19. The semiconductor laser of claim 14 wherein the active region includes a carrier-confinement layer comprising aluminum gallium arsenide (AlGaAs).

20. The semiconductor laser of claim 19 wherein the active region further includes an indium gallium phosphide (InGaP) cap layer overlying the AlGaAs current-confinement layer.

21. The semiconductor laser of claim 14 wherein the plurality of semiconductor layers are doped to form a semiconductor p-n or p-i-n junction about the active region.

22. The semiconductor laser of claim 21 wherein the active region comprises a plurality of alternating layers of tensile-strained gallium arsenide phosphide (GaAsP), compressively-strained indium gallium arsenide (InGaAs), and aluminum gallium arsenide (AlGaAs).

23. The semiconductor laser of claim 21 wherein the active region comprises a plurality of alternating layers of gallium arsenide (GaAs) and aluminum gallium arsenide (AlGaAs).

24. The semiconductor laser of claim 21 further comprising an upper electrode above the active region and a lower electrode on the substrate for electrical activation of the semiconductor laser.

25. The semiconductor laser of claim 21 further including a third reflector epitaxially grown above the active region, with the third reflector comprising a plurality of alternating low-refractive-index and high-refractive-index semiconductor layers reflective of the fundamental frequency for wavelength control thereof.

26. The semiconductor laser of claim 21 wherein the external energy source comprises electrical excitation with an electrical current flowing through the semiconductor junction.

27. The semiconductor laser of claim 14 wherein the external energy source comprises optical pumping with lasing light from at least one pump laser.

28. The semiconductor laser of claim 27 wherein the lasing light from the pump laser is incident on the plurality of semiconductor layers at a Brewster angle.

29. The semiconductor laser of claim 28 wherein the Brewster angle is about 74° as measured from an axis normal to an upper surface of the substrate.

30. The semiconductor laser of claim 27 wherein each pump laser comprises a semiconductor laser.

31. The semiconductor laser of claim 14 further including a Fabry-Perot etalon located within the air gap to narrow a bandwidth of the fundamental frequency.

32. The semiconductor laser of claim 14 wherein the fundamental frequency corresponds to a wavelength in the range of 600–1100 nanometers, and the second-harmonic frequency corresponds to a wavelength in the range of 300–550 nanometers.

33. The semiconductor laser of claim 32 wherein the fundamental frequency corresponds to a wavelength of about 980 nanometers, and the second-harmonic frequency corresponds to a wavelength of about 490 nanometers.

34. The semiconductor laser of claim 32 wherein the fundamental frequency corresponds to a wavelength of about 860 nanometers, and the second-harmonic frequency corresponds to a wavelength of about 430 nanometers.

35. The semiconductor laser of claim 14 wherein the nonlinear crystal comprises potassium niobate ($KNbO_3$).

36. The semiconductor laser of claim 35 wherein the first surface of the nonlinear crystal is substantially planar.

37. The semiconductor laser of claim 36 wherein the second surface of the nonlinear crystal has a 15-millimeter radius of curvature.

38. The apparatus of claim 14 wherein the air gap is 1–3 millimeters thick.

* * * * *